(12) United States Patent
Im et al.

(10) Patent No.: US 7,286,399 B2
(45) Date of Patent: *Oct. 23, 2007

(54) DEDICATED REDUNDANCY CIRCUITS FOR DIFFERENT OPERATIONS IN A FLASH MEMORY DEVICE

(75) Inventors: Jae-woo Im, Gyeonggi-do (KR); Young-ho Lim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 193 days.

This patent is subject to a terminal disclaimer.

(21) Appl. No.: 11/138,715

(22) Filed: May 26, 2005

(65) Prior Publication Data

US 2005/0219898 A1    Oct. 6, 2005

(51) Int. Cl.
*G11C 10/06*    (2006.01)

(52) U.S. Cl. .............................. 365/185.09; 365/185.11; 365/185.17; 365/185.21; 365/185.23; 365/185.33

(58) Field of Classification Search .......... 365/185.09, 365/185.11, 185.17, 185.21, 185.23, 185.33
See application file for complete search history.

(56) References Cited

U.S. PATENT DOCUMENTS

| 5,347,484 | A | | 9/1994 | Kwong et al. |
|---|---|---|---|---|
| 5,699,306 | A | | 12/1997 | Lee et al. |
| 6,134,143 | A | * | 10/2000 | Norman .................. 365/185.09 |
| 6,240,040 | B1 | | 5/2001 | Akaogi et al. |
| 6,381,174 | B1 | | 4/2002 | Roohparvar et al. ... 365/185.09 |
| 6,397,313 | B1 | | 5/2002 | Casa et al. |
| 6,462,994 | B2 | | 10/2002 | Kim |
| 6,469,932 | B2 | | 10/2002 | Roohparvar et al. ... 365/185.09 |

FOREIGN PATENT DOCUMENTS

KR       95003400 B1      4/1995

OTHER PUBLICATIONS

Notice to File a Response/Amendment to Examination Report; Korean Application No. 2002-55290; Sep. 14, 2004.

* cited by examiner

*Primary Examiner*—Hoai V. Ho
(74) *Attorney, Agent, or Firm*—Myers, Bigel, Sibley & Sajovec, P.A.

(57) ABSTRACT

A flash memory device can include a bank including normal memory cells and redundant memory cells arranged in a matrix of rows and columns. A read redundancy circuit is configured to generate read repair information in response to read address information during a read operation. A write redundancy circuit is configured to generate write repair information in response to write address information during a write operation. A write driver circuit is configured to drive normal and/or redundant memory cells with data bits to be written in response to the write repair information. A sense amplifier circuit is configured to sense and amplify data bits from normal memory cells and a data bit from a redundant memory cell in the bank and to replace one of the sensed data bits from the normal memory cells with the sensed data bit read from the redundant memory cell in response to the read repair information.

16 Claims, 7 Drawing Sheets

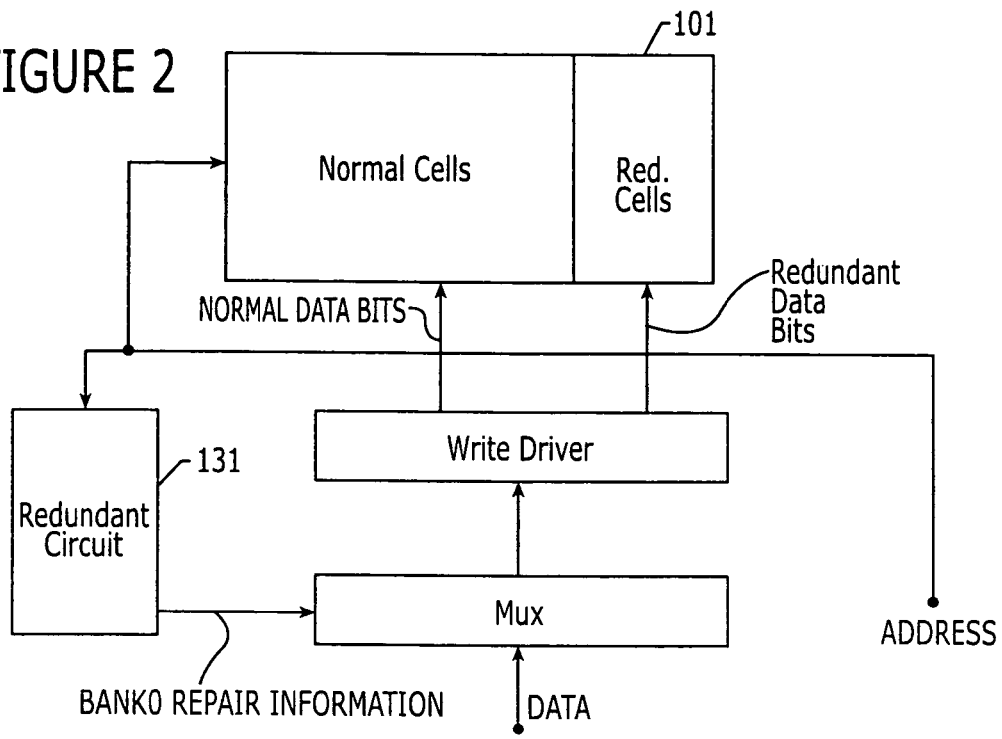
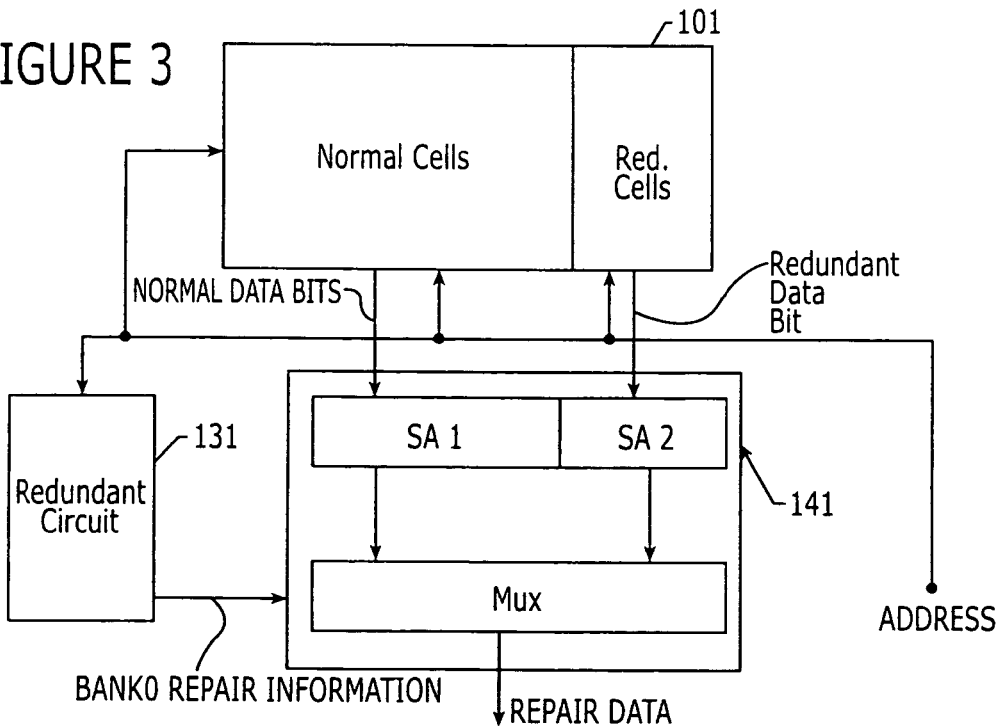

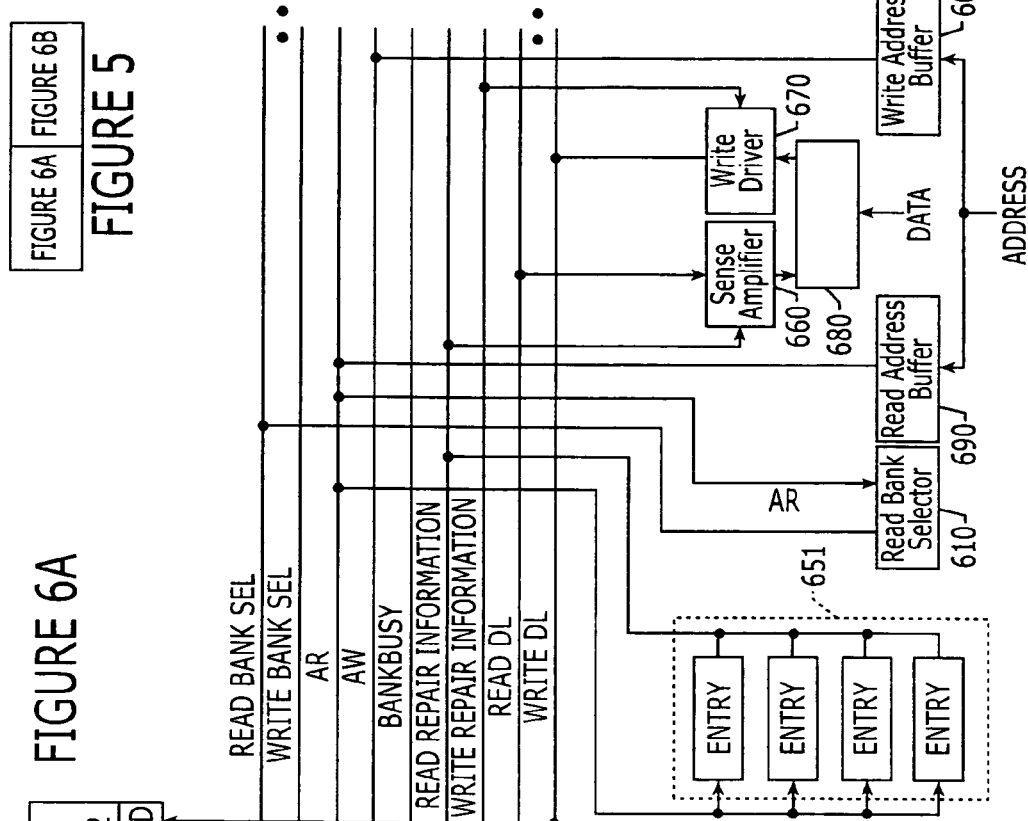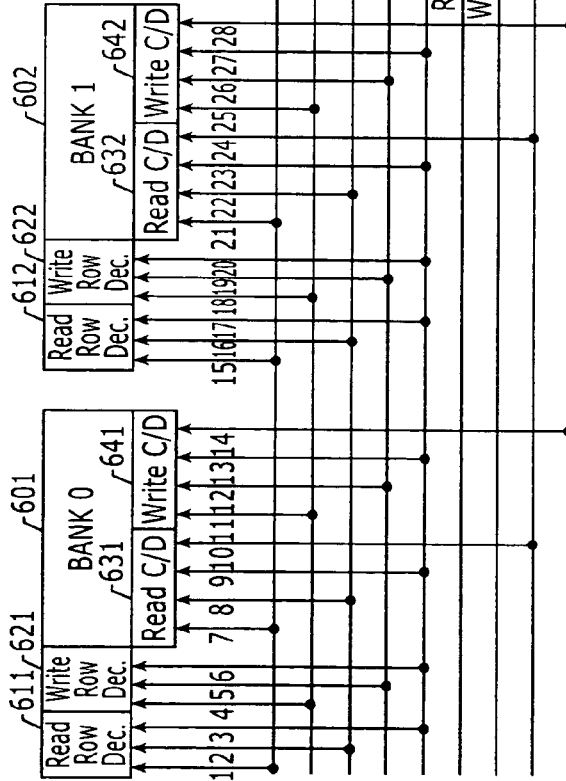

DEDICATED REDUNDANCY CIRCUITS FOR DIFFERENT OPERATIONS IN A FLASH MEMORY DEVICE

RELATED APPLICATIONS

This application claims priority to U.S. Non-provisional Patent Application No. 10/630,116, filed: Jul. 30, 2003, which claimed priority to Korean Application No. 2002-0052290, filed Sep. 12, 2002, the entire contents of which are incorporated herein by reference.

FIELD OF THE INVENTION

The invention relates to the field of integrated circuit memory devices and methods of operating the same and, more particularly, to the field of non-volatile integrated circuit memory devices and methods of operating the same.

BACKGROUND

Flash EPROM devices, sometimes referred to as flash memory devices, typically include at least one memory array organized into rows and columns of flash memory cells. The array is typically partitioned into blocks, each of which is further divided into sectors. A row decoder and a column decoder are used to select a single row and at least one column of memory cells based upon the value of an externally generated address applied to the flash memory device. Sense amplifiers are coupled to column lines corresponding to the columns of memory cells to amplify the voltage levels on the addressed column lines corresponding to the data values stored in the addressed flash memory cells. The particular implementations of known arrays and row/column decoders will not be discussed further herein.

It is known for memory devices to have defects which can prevent the device from operating as designed. In particular, defects can occur during the manufacture of flash memory devices so that memory cells within the array do not operate properly. For example a defect in a memory cell (or associated circuitry) can cause data written to the memory cell to be stored incorrectly or not at all. Furthermore, the defect may prevent the data from being reliably read from the addressed memory cell. Any of these types of defects can reduce the manufacturing yield for the flash memory device.

It is know to include redundant memory cells in the flash memory, which can selectively replace normal memory cells that are determined to be defective to improve the manufacturing yield of the flash memory. Some flash memory devices, utilize non-volatile registers to store addresses of memory cells that are known to be defective. The addresses associated with the defective memory cells can be stored in the registers and compared to addresses associated with memory operations (i.e., read operations and write operations). If the address matches an address stored in the register, a redundant circuit can re-route (or map) the data to or from the memory so that the defective memory cells are not used for the memory operation. For example, during a write operation, write data (which would otherwise be directed to a known defective memory cell) can be re-routed to a redundant memory cell. Later, when a read operation is directed to the address of the known defective memory cell, the redundant memory cell, as well as the known defective memory cells, is accessed. The data retrieved from the redundant memory cell is re-routed to replace the data that was read from the known defective memory cell to provide the data that was previously written to the accessed address.

FIG. 1 illustrates a conventional multi-bank flash memory device 100. In particular, the conventional multi-bank flash memory device includes two banks: BANK0 101 and BANK1 102. Each of the banks has an associated row and column decoder that selects a set of memory cells in the respective bank to be accessed based on an address provided to the respective row/column decoder. BANK0 101 has an associated row decoder 111 and a column decoder 121 that receive respective addresses via address lines ABANK0. Similarly, BANK1 102 has an associated row decoder 112 and a column decoder 122 which select memory cells within the BANK1 102 to be accessed based on addresses provided via address lines ABANK 1.

Each of the respective banks also includes redundant memory cells that can be accessed with the normal memory cells associated therewith. Accordingly, when data is written normal memory cells (or read from normal memory cells), data is also written to (or read from) the redundant memory cells selected by the respective row/column decoders.

The addresses are provided to the respective banks by address buffers 171 and 172. In particular, address buffer 171 provides the addresses for the row/column decoders 111, 121 associated with BANK0 101 whereas address buffer 172 provides the addresses for the row/column decoders 112, 122 associated with BANK1 102. Accordingly, different addresses can be provided to the different banks.

Data can be provided to/from the respective banks to a respective combination of sense amplifiers and write drivers dedicated to each of the banks. In particular, data to be written to BANK0 101 is provided by a write driver 151 via data lines BANK0DL whereas data to be written to BANK1 102 is provided by a write driver 152 via data lines BANK1DL. Data read from BANK0 101 is provided to a sense amplifier 141 via data lines BANK0DL (i.e., the same lines used to provide write data to the BANK0 101). Data read from BANK1 102 is provided to a sense amplifier 142 via data lines BANK1DL (i.e., the same lines used to provide write data to BANK1 102). The data written to (or read from) either of the banks flows to/from the memory device via a data input/output buffer 160.

Each of the banks has an associated redundancy circuit. In particular, BANK0 101 has an associated redundancy circuit 131 whereas the BANK1 102 has an associated redundancy circuit 132. The redundancy circuits 131, 132 provide redundancy entries which identify memory cells within the respective bank that are known to be defective. In particular, the redundancy circuit 131 can include up to 4 entries each of which can identify an address within BANK0 101 which is known to include a defective memory cell. Similarly, the redundancy circuit 132 can include up to 4 entries each of which can identify a known defective memory cell within BANK1 102. As briefly discussed above, the entries in the redundancy circuits 131, 132 can be used to avoid known defective memory cells.

FIG. 2, illustrates a general write operation carried out in BANK0 101. In particular, an address for the write operation is provided to BANK0 101 so that the normal and redundant cells associated with the address within the bank can be accessed. The address is also provided to the redundancy circuit 131. The redundancy circuit 131 compares the address used for the write operation with the addresses of known defective memory cells in the BANK0 101. If the address for the write operation matches an address of a known defective memory cell within the bank, the redundancy circuit 131 provides information associated with the matching address that can be used to write some of the data to a redundant memory cell rather than to a known defective memory cell.

The redundancy circuit 131 provides BANK0 REPAIR INFORMATION to a multiplexer 153 included within the data input/output buffer 160 shown in FIG. 1. The multiplexer 153 "maps" the data bit within the data word DATA that would otherwise be written to the known defective memory cell to a redundant data line coupled to the redundant memory cell associated with the address in BANK0 101 to be written. Accordingly, the conventional system shown in FIG. 1 can avoid writing data to known defective memory cells by, instead, storing data in redundant cells associated with the same address.

FIG. 3 generally illustrates a read operation directed to BANK0 101 shown in FIG. 1. The address for the read operation is provided to both the normal cells and the redundant cells in BANK0 101 so that data can be retrieved from both the normal cells and the redundant cells. In particular, NORMAL DATA BITS are retrieved from the normal memory cells whereas the REDUNDANT DATA BIT is retrieved from the redundant memory cell having the same address as the normal memory cells that are accessed. The NORMAL DATA BITS and the REDUNDANT DATA BIT are provided to the sense amplifier 141.

In addition to providing the address for the read operation to the normal and redundant cells of BANK0 101, the address is also provided to the redundancy circuit 131 that includes the entries identifying the known defective memory cells in the BANK0 101. The redundancy circuit 131 compares the address provided to the BANK0 101 with the addresses associated with the known defective memory cells in BANK0 101. If the address for the read operation matches any of the addresses of known defective memory cells in BANK0 101, BANK0 REPAIR INFORMATION is provided to a multiplexer included in the sense amplifier 141. The BANK0 REPAIR INFORMATION provided by the redundancy circuit 131 identifies which bit included in the DATA retrieved from the normal cells of BANK0 101 is known to be defective. Accordingly, the multiplexer maps the bit retrieved from the redundant cell in BANK0 101 to replace the bit of the DATA retrieved from the normal memory cells which is known to be defective. The multiplexer provides the "repaired" DATA as output.

FIG. 4 illustrates a multi-bank flash memory device 200 that is similar to the structure shown in FIG. 1, but includes 16 banks rather than 2 banks. The operation and structure of the multi-bank system shown in FIG. 4 is similar to that described in reference to FIGS. 1-3. In particular, each of the banks 0 to 15 has an associated redundancy circuit each of which can include up to four entries. The entries within each of the redundancy circuits can identify a known defective memory cell within its corresponding bank. For example, redundancy circuit 231 includes up to four entries each of which can identify a known defective memory cell in the BANK0 associated with the redundancy circuit 231. Likewise, redundancy circuits 232, 233, 234 can each include up to four entries, each of which can identify a known defective memory cell in banks BANK1, BANK14, and BANK 15 respectively.

Redundant memory cells for flash memory devices are also discussed in U.S. Pat. No. 6,469,932 to Roohparvar et al., and in U.S. Pat. No. 6,381,174 to Roohparvar et al., the contents of which are incorporated herein by reference.

SUMMARY

Embodiments according to the invention can provide dedicated redundancy circuits for different operations in a flash memory device. Pursuant to these embodiments, a flash memory device can include a bank including normal memory cells and redundant memory cells arranged in a matrix of rows and columns. A read redundancy circuit is configured to generate read repair information in response to read address information during a read operation. A write redundancy circuit is configured to generate write repair information in response to write address information during a write operation. A write driver circuit is configured to drive normal and/or redundant memory cells with data bits to be written in response to the write repair information. A sense amplifier circuit is configured to sense and amplify data bits from normal memory cells and a data bit from a redundant memory cell in the bank and to replace one of the sensed data bits from the normal memory cells with the sensed data bit read from the redundant memory cell in response to the read repair information.

In some embodiments according to the invention, a flash memory device includes a first redundancy circuit configured to provide read repair information for read operations to the flash memory. A second redundancy circuit is separate from the first redundancy circuit and is configured to provide write repair information for write operations to the flash memory. The first redundancy circuit is electrically connected to data lines for read operation and the second redundancy circuit is electrically connected to data lines for write operation.

BRIEF DESCRIPTION OF THE DRAWINGS

FIG. 2 is a block diagram illustrating a read operation for the conventional multi-bank flash memory device shown in FIG. 1.

FIG. 3 is a block diagram illustrating a write operation for the conventional multi-bank flash memory device shown in FIG. 1.

FIG. 5 is a hierarchical drawing illustrating a relationship between the block diagrams shown in FIGS. 6A-6B according to embodiments of the invention.

FIGS. 6A-6B are block diagrams illustrating embodiments of multi-bank flash memory devices according to the present invention.

Figure 1:
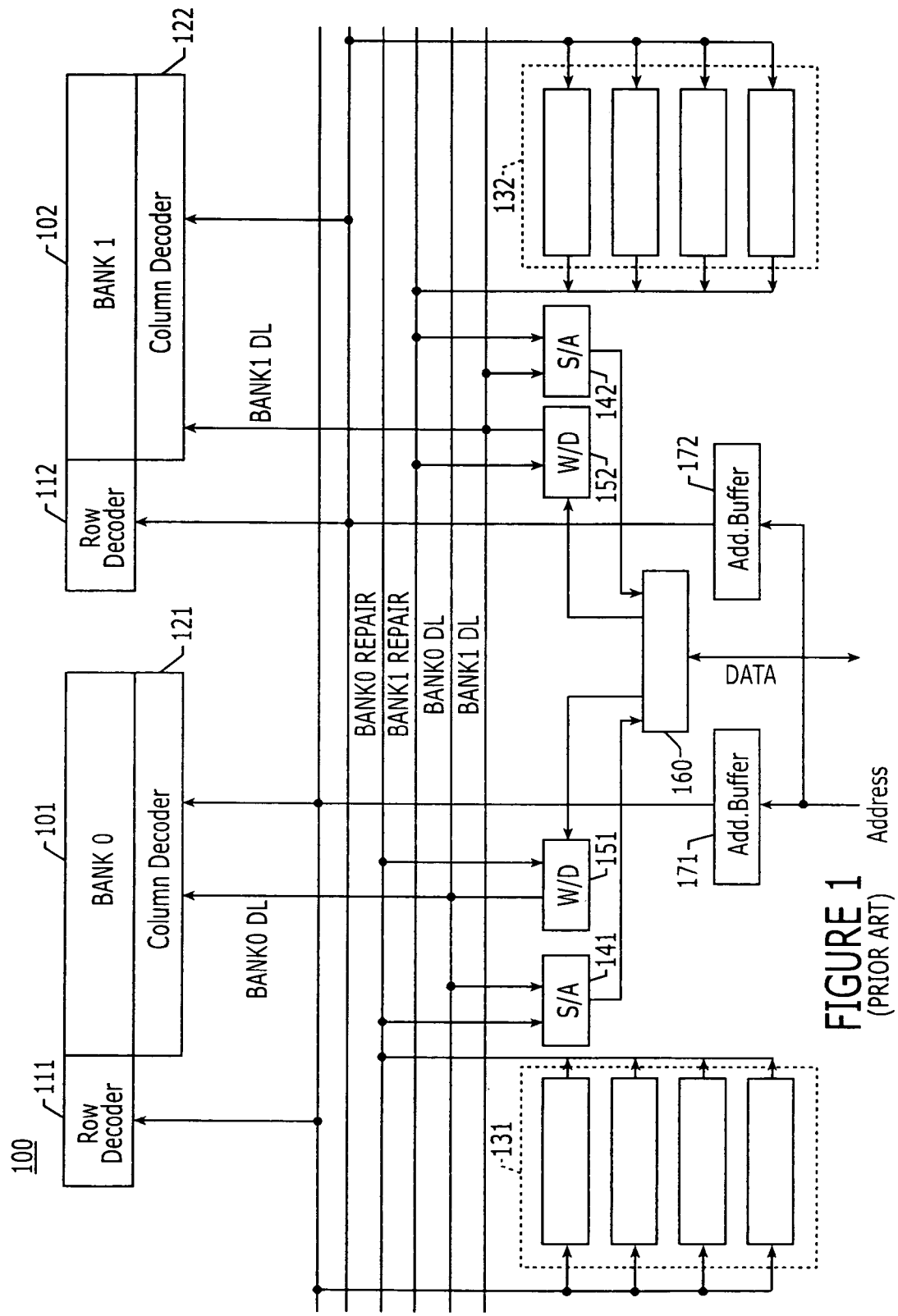
FIG. 1 is a block diagram illustrating a conventional multi-bank flash memory device.
Figure 4:
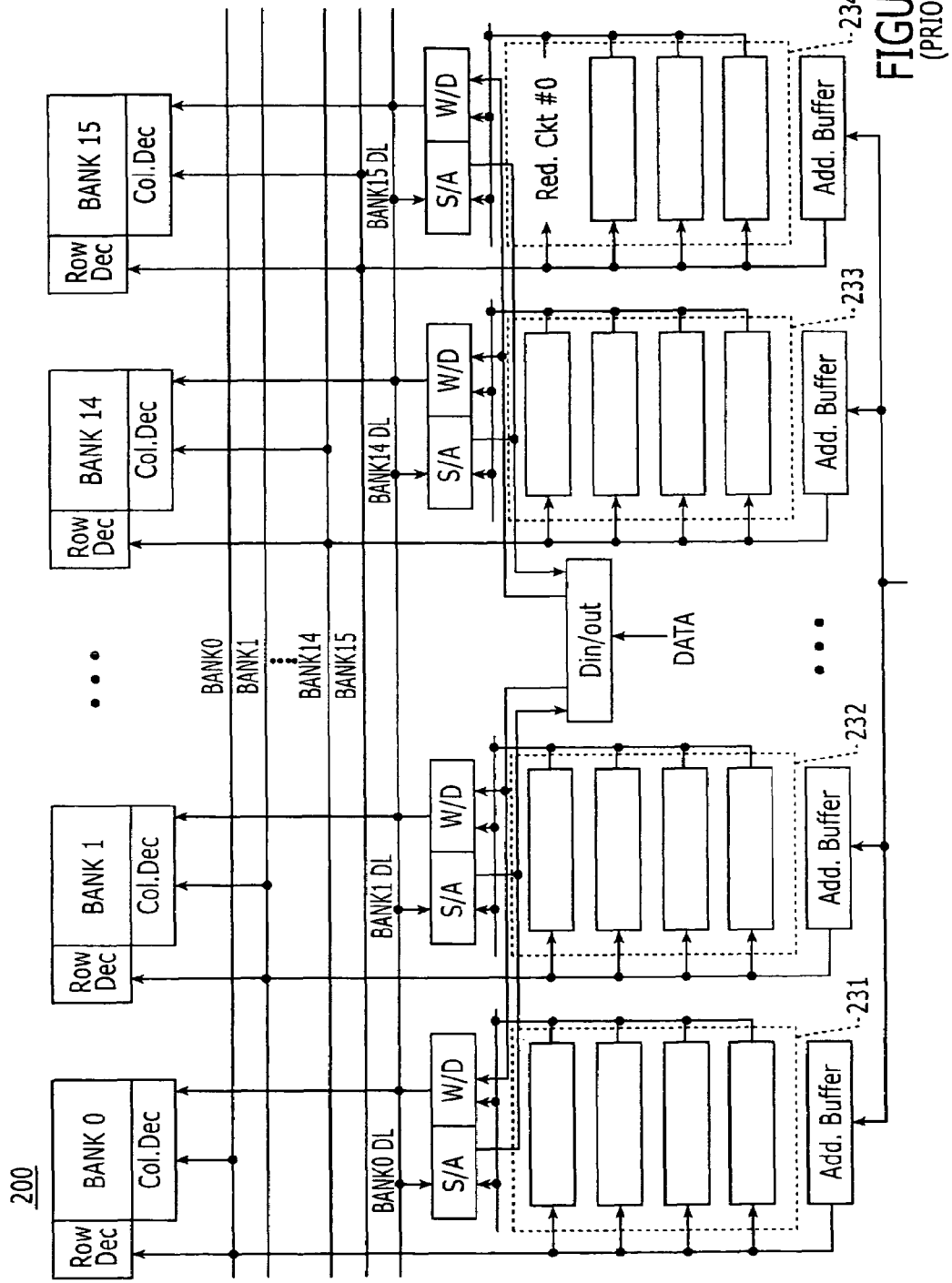
FIG. 4 is a block diagram illustrating a conventional multi-bank flash memory device.

DESCRIPTION OF EMBODIMENTS
ACCORDING TO THE INVENTION

The invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity.

It will be understood that when an element such as a circuit is described as being "coupled" to another element, it can be directly coupled to the other element or intervening elements may also be present. It will be understood that although the terms first and second are used herein to describe various regions, layers and/or sections, these regions, layers and/or sections should not be limited by these terms. These terms are only used to distinguish one region, layer or section from another region, layer or section. Thus, for example, a first circuit discussed below could be termed a second circuit, and similarly, a second circuit may be termed a first circuit without departing from the teachings of the present invention.

According to embodiments of the invention, separate redundancy circuits can provide repair information for different memory operations. In particular, one redundancy circuit can provide repair information for write operations (i.e., a write redundancy circuit) whereas another redundancy circuit can provide repair information for read operations (i.e., a read redundancy circuit). Furthermore, each of the dedicated redundancy circuits can provide the appropriate repair information for memory operations to any of the banks of the flash memory. For example, the write redundancy circuit can provide write repair information for write operations to any of the banks of the flash memory whereas the read redundancy circuit can provide the read repair information for read operations to any of the banks.

Accordingly, different entries in one of the redundancy circuits can identify known defective memory cells across multiple banks of the flash memory, thereby avoiding the need to have a redundancy circuit dedicated to each of the banks of the multi-bank flash memory. Because a single redundancy circuit can provide repair information for any of the banks during a particular type of memory operation, the redundancy circuitry can be more efficiently utilized to provide redundancy for the multi-bank flash memory. For example, in some embodiments according to the invention, all of the known defective memory cells may be in a single one of the banks whereas in another embodiment according to the invention, the defective memory cells could be located in different banks of the multi-bank flash memory device. In both of these embodiments, a single redundancy circuit can provide the repair information (for a type of memory operation) thereby reducing the need for a dedicated redundancy circuit for each of the banks as done in conventional systems.

Figure 6B:
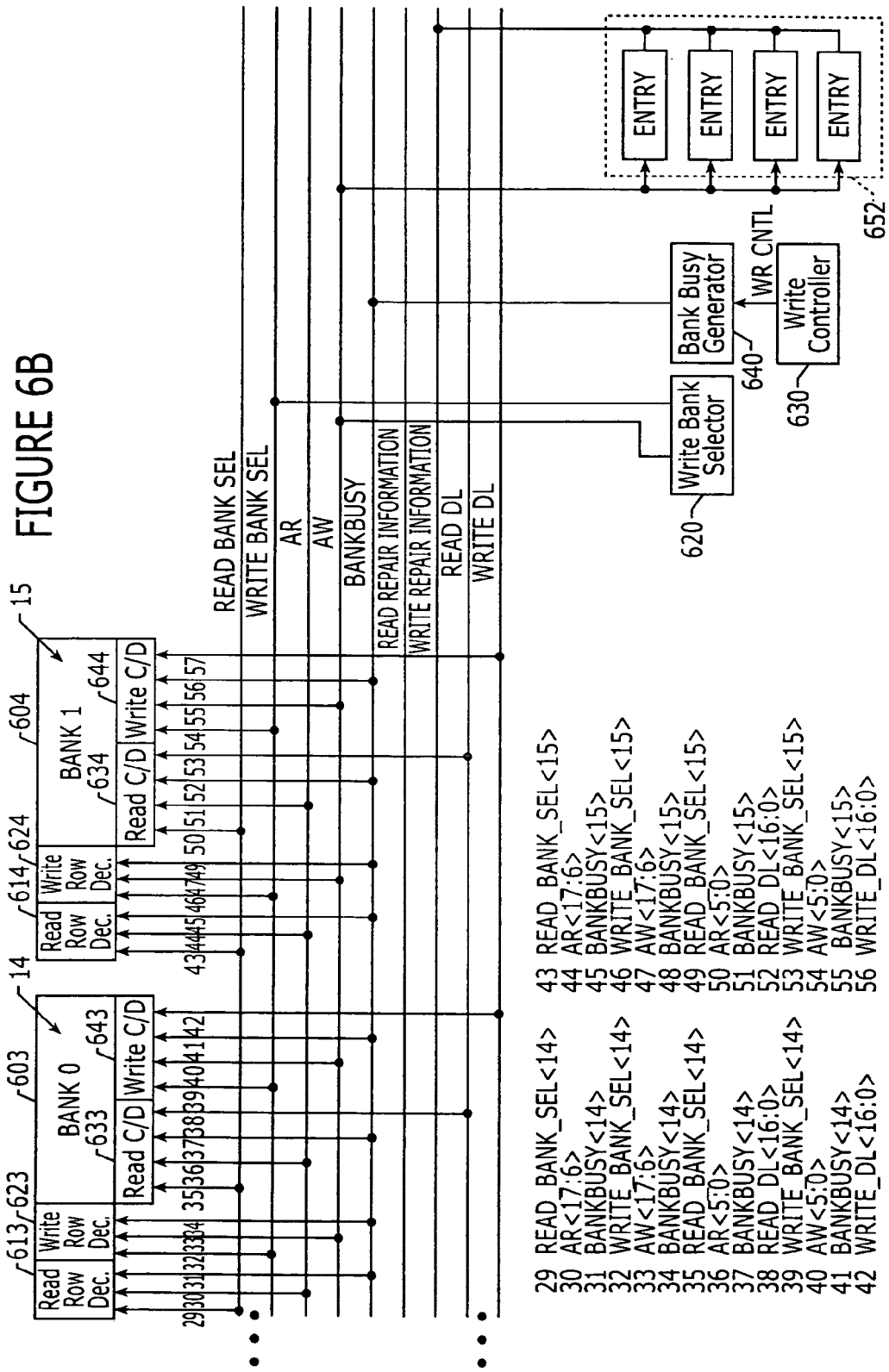

FIG. 5 is a hierarchical diagram showing the relationship between the block diagrams shown in FIGS. 6A-6B. In particular, FIGS. 6A-6B illustrate embodiments of multi-bank flash memory devices according to the present invention connected via signals, such as address lines, data lines, read/write repair lines, and the like.

It will be understood that although FIGS. 6A and 6B illustrate embodiments of multi-bank flash memory devices including 16 banks of memory (banks 0-15), the invention may be practiced utilizing fewer or more banks of flash memory. Moreover, although FIGS. 6A-6B show specific a numbering scheme of, for example, the address and data lines provided to the circuits and elements illustrated (such as AR<21:0> and READ DL<16:0>), it will be understood that the numbering scheme is illustrative of the invention and may be practiced in other embodiments using fewer or more of the signal lines shown in the figures, such as in embodiments where fewer or more banks of memory are used.

FIGS. 6A-6B are block diagrams that illustrate embodiments of multi-bank flash memory devices having dedicated read and write redundancy circuits according to the invention. In general, each of the banks of the flash memory device BANK0 601 to BANK15 604 include memory cells and associated redundant memory cells which can be accessed by providing address information to the respective row and column decoders coupled to each of the banks. For example, the normal and redundant memory cells included in BANK0 601 can be accessed by providing appropriate addressing to either the read column decoder 631 and the read row decoder 611 (for a memory read operation) or to the write column decoder 641 and the write row decoder 621 (during a memory write operation). The other banks of the flash memory device can be similarly accessed using the respective read row/column decoders or write row/column decoders associated with each of the banks.

In some embodiments as shown in FIG. 6A, the address for the memory operation is provided via a read address buffer 690 or a write address buffer 600 depending on the type of operation to be performed. In the case of a read operation, the read address buffer 690 provides the address to dedicated address lines used for read operations (AR<21:0>) which are provided to the read column and row decoders in each of the banks of the flash memory and to a read redundancy circuit 651. In some embodiments according to the invention, some of the read address is provided to a read bank selector 610 that decodes which of the banks in the multi-bank flash memory device is to be accessed during the current read operation.

The read redundancy circuit 651 is a separate redundancy circuit that is dedicated to providing read repair information READ IO REPAIR <15:0> only during read operations in the memory. The read repair information can be provided by the read redundancy circuit 451 for read operations directed to any of the banks in the multi-bank flash memory device. The read redundancy circuit 451 includes a plurality of entries each of which stores an address of a known defective memory cell in any of the banks of the flash memory device. The entry also includes the read repair information READ IO REPAIR <15:0> that identifies which of the data bits accessed by the read address is known to be defective. In particular, as shown in FIG. 6A, a read operation retrieves 17 data bits (i.e., READ DL <16:0>) from the addressed bank where 16 of the data bits are provided by normal memory cells and 1 of the data bits is provided by the redundant memory cell which is associated with the normal memory cells accessed.

The read repair information READ IO REPAIR <15:0> provided by the read redundancy circuit 651 can identify which of the 16 data bits provided by the accessed normal memory cells corresponds to the known defective memory cell. The read repair information READ IO REPAIR <15:0> can, therefore, be used by a sense amplifier circuit 660 to replace the data bit provided by the known defective memory cell with the data provided by the redundant memory cell. The 16 bit data word provided by the sense amplifier circuit 660 (i.e. including the data bit from the redundant memory cell) can be output from the memory device through a data input/output buffer 680.

As shown in FIGS. 6A-6B, the address is provided to write address lines AW <21:0> via a write address buffer 400. In some embodiments according to the invention, selected ones of the address lines, such as AW <21:18>, are provided to a write bank selector 420 that generates an active write bank select signal to the bank that is to be written on WRITE BANK SEL <15:0>. In particular, the write bank select signal coupled to the bank that includes the memory cells identified by the write address AW <21:0> becomes active for the write operation whereas each of the other respective write bank select signals remains inactive. A write controller 630 provides a write control signal to a bank busy generator 640. The bank busy generator 640 provides an active BANKBUSY signal to the bank that includes the memory cells identified by the address for the write operation via the BANKBUSY <15:0> lines whereas the BANKBUSY signals to the other banks remain inactive.

The write addresses AW <21:0> are also provided to a write redundancy circuit 652 that includes a plurality of entries each indicating an address of a known defective memory cell in the memory device. Each of the plurality of entries in the write redundancy circuit 652 includes associated write repair information that identifies which of the data bits associated with the respective address of the known defective memory cells is defective. The write redundancy circuit 652 provides the write repair information for write operations in any of the banks of the flash memory device.

The write redundancy circuit 652 provides the write repair information only for write operations and not for read operations. The write repair information is provided to a write driver circuit 670 so that data provided by the data input/output buffer circuit 680 can be mapped to avoid use of the known defective memory cell identified by the entry in the write redundancy circuit 652. In particular, the write driver 670 can re-route a data bit provided by the data input/output buffer 680, which would otherwise be written to the known defective memory cell, to be written to redundant memory cell associated with the write address AW <21:0>.

Figure 7:
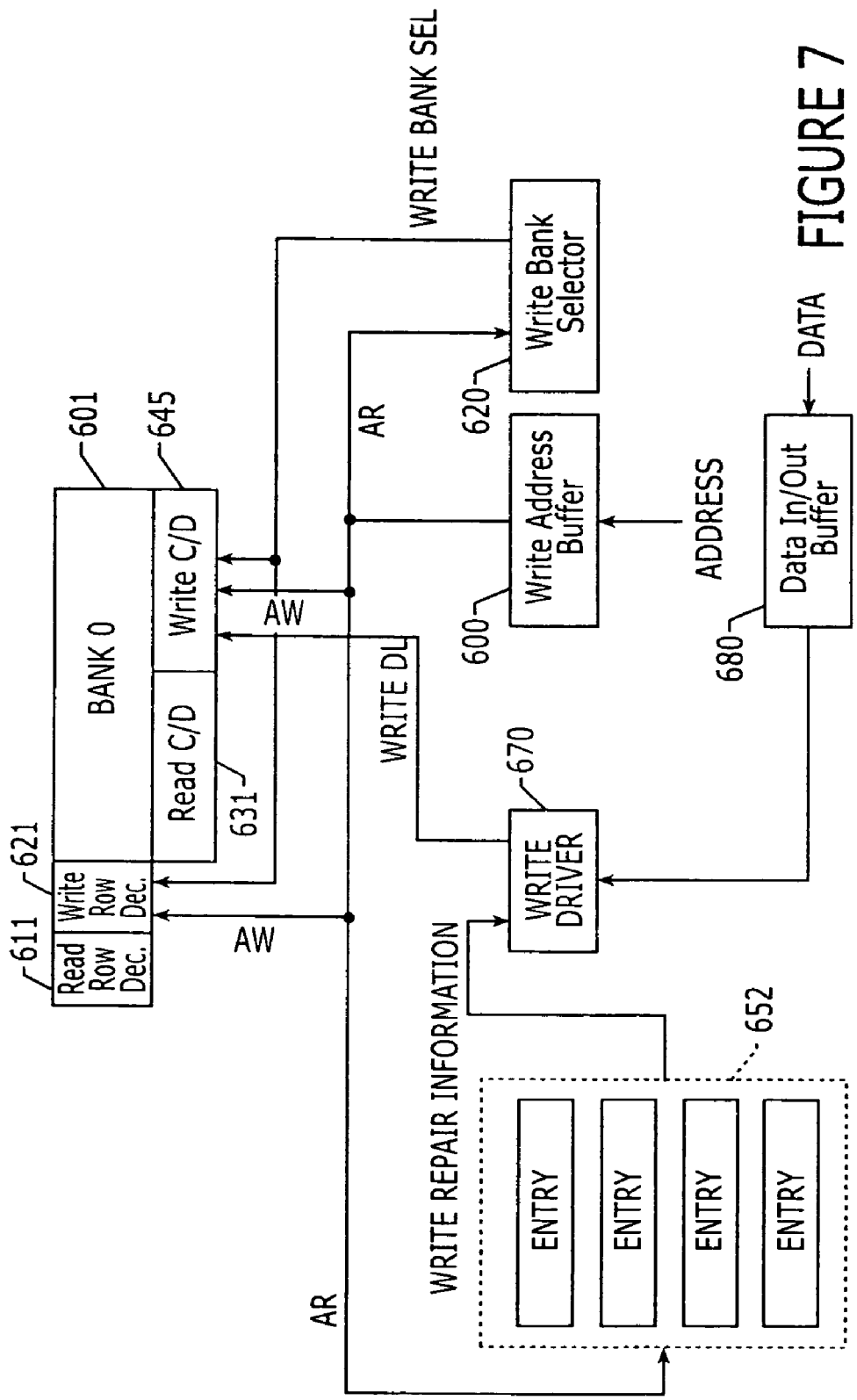
FIG. 7 is a block diagram illustrating write operations for embodiments of multi-bank flash memory devices according to the present invention.

FIG. 7 is a block diagram that illustrates exemplary write operations to BANK0 601 according to embodiments of the present invention. According to FIG. 7, the write address AW <21:0> is provided to the write address buffer 600. The write address buffer 600 provides the write address AW <21:0> to the write row decoder 621 and to the write column decoder 641 associated BANK0 601 of the flash memory device. The write address AW <21:0> is also used by the write bank selector 620 to generate a write bank select signal WRITE BANK SEL <0> that indicates that BANK0 601 in the flash memory device is to be written based on the write address AW <21:0>.

The write address AW <21:0> is also provided to the write redundancy circuit 652. The write redundancy circuit 652 compares the write address AW <21:0> to each of the plurality of entries included therein. Each of the entries in the write redundancy circuit 652 includes an address of a known defective memory cell in the flash memory device and associated write repair information that indicates which of the memory cells to be accessed for the write operation is known to be defective. For example, the write repair information can be a mask including a bit for each of the bits in the data word to be written to flash memory during the write operation. The write repair information can indicate which of the data bits in the data word would otherwise be written to the defective memory cell associated with the write address by, for example, being a logic "high" level whereas the remaining bits in the write repair information are a logic "low" level.

If the write address AW <21:0> matches any of the entries included in the write redundancy circuit 652, the associated write repair information WRITE REPAIR INFORMATION <15:0> is provided to the write driver 670. The write driver 670 reroutes the data bit identified by the WRITE REPAIR INFORMATION <15:0> to write data line that is coupled to the redundant memory cell, such as WRITE DL <16> to avoid writing the identified data bit to the known defective memory cell. The write driver 670 can, therefore, reroute the appropriate data bit included in DATA <15:0> so that it is written to the redundant memory cell associated with the write address AW <21:0> rather than the defective memory cell.

Figure 8:
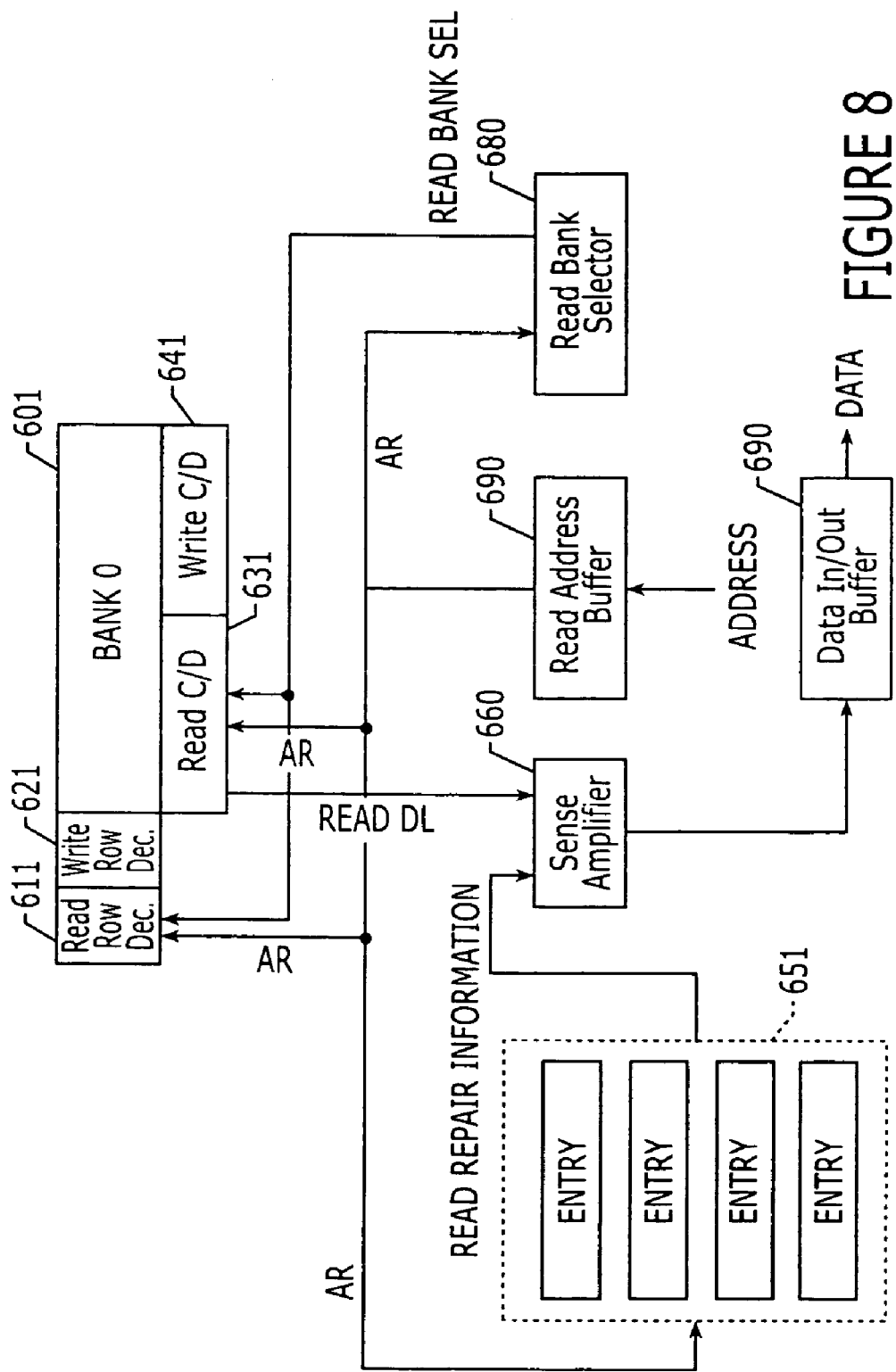
FIG. 8 is a block diagram illustrating read operations for embodiments of multi-bank flash memory devices according to the present invention.

FIG. 8 is a block diagram that illustrates exemplary read operations to BANK0 601 according to embodiments of the present invention. As shown in FIG. 8, a read address AR <21:0> is provided to the read address buffer 690 which outputs the read address AR <21:18> to the read bank selector 610 which generates a read bank select signal to the read row and column decoder 611 and 631, respectively.

The read address AR <21:0> is also provided to the read redundancy circuit 651 which includes a plurality of entries that store addresses of known defective memory cells and associated read repair information that can be used to reroute data read from the redundant memory cell to a data line that would otherwise provide data from the known defective memory cell. In particular, the read repair information READ REPAIR INFORMATION <15:0> is provided to the sense amplifier 660 via READ REPAIR LINES <15:0>. The READ REPAIR INFORMATION <15:0> can be, for example, a 16 bit word that identifies which of the bit positions of the data read from the memory corresponds to the known defective memory cell. The sense amplifier 660 can replace the data provided by the known defective memory cell with the data provided by the redundant memory cell.

Defective memory cells can be identified by testing each of the memory cells during manufacturing of the flash memory device. Upon determining which memory cells are defective, the write redundancy circuit 652 and the read redundancy circuit 651 can be programmed, using for example fuses, to store the addresses of the memory cells determined to be defective and the repair information associated with each of the addresses. Accordingly, the addresses and repair information programmed into the separate read and write redundancy circuits 651, 652 are the same.

During a write operation to the flash memory device, the write repair information, stored in the write redundancy circuit 652, is used to write data to the redundant memory cell that is associated with the write address in the selected bank rather than the defective memory cell. When a read operation is performed to the same address, the read repair information stored in the read redundancy circuit 651 is used to replace the data provided by the known defective memory cell with the data that is retrieved from the redundant memory cell to which the data was written during the preceding write operation to the same address. Accordingly, the write redundancy circuit 652 is used during write operations whereas the read redundancy circuit 651 is used during read operations.

Accordingly, in some embodiments according to the present invention as discussed above, the write redundancy circuit 652 can be dedicated to providing write repair information for write operations in the flash memory device whereas the read redundancy circuit 651 is dedicated to providing read repair information for read operations in the flash memory device. Moreover, the read redundancy circuit 651 and the write redundancy circuit 652 can each include entries for any of the plurality of banks in the flash memory device. For example, the entries in the read redundancy circuit 651 and the write redundancy circuit 652 can indicate that a defective memory cell is present in any of the banks BANK0 601, BANK1 602 . . . BANK14 603, and BANK15 604, of the flash memory device. Accordingly, when a write operation is directed to any of the banks, the write redundancy circuit 652 provides the write repair information to avoid using the known defective memory cell. Likewise, the read redundancy circuit 651 provides the read repair information for read operations directed to any of the banks so that the data provided from the redundant memory cell replaces the data that is retrieved from the known defective memory cell.

As will be understood by those skilled in the art, a flash memory device according to the present invention can support what is referred to as Read-While-Write operation. In particular, a flash memory device according to the present invention can perform a read operation while a write operation is being performed in another bank of the flash memory. Furthermore, it will be understood by those skilled in the art, that a flash memory device according to the present invention can be a NOR or a NAND type flash memory device.

Many alterations and modifications may be made by those having ordinary skill in the art without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A flash memory device comprising:
a bank including normal memory cells and redundant memory cells arranged in a matrix of rows and columns;
a read redundancy circuit configured to generate read repair information in response to read address information during a read operation;
a write redundancy circuit configured to generate write repair information in response to write address information during a write operation;
a write driver circuit configured to drive normal and/or redundant memory cells with data bits to be written in response to the write repair information; and
a sense amplifier circuit configured to sense and amplify data bits from normal memory cells and a data bit from a redundant memory cell in the bank and to replace one of the sensed data bits from the normal memory cells with the sensed data bit read from the redundant memory cell in response to the read repair information.

2. The flash memory device according to claim 1, wherein the write driver circuit re-routes one of the data bits to be written in the bank to a redundant memory cell in response to the write repair information, wherein the one of the data bits is related to a defective normal memory cell which is associated with the write address information.

3. The flash memory device according to claim 1, further comprising:
a read row decoder configured to select one of the rows in response to a row address of the read address information during the read operation; and
a read column decoder configured to select ones of the columns in response to a column address of the read address information during the read operation.

4. The flash memory device according to claim 3, further comprising:
a write row decoder configured to select one of the rows in response to a row address of the write address information during the write operation; and
a write column decoder configured to select ones of the columns in response to a column address of the write address information during the write operation.

5. The flash memory device according to claim 4, further comprising:
a read bank selector circuit configured to generate a read bank select signal in response to a bank address of the read address information, the read row and column decoders being activated by the read bank select signal.

6. The flash memory device according to claim 5, further comprising:
a write bank selector circuit configured to generate a write bank select signal in response to a bank address of the write address information, the write row and column decoders being activated by the write bank select signal.

7. The flash memory device according to claim 5, further comprising:
a write controller configured to generate a write control signal during the write operation; and
a bank busy generator circuit configured to generate a bank busy signal during the write operation, the bank busy signal being applied to the read row and column decoders and the write row and column decoders.

8. The flash memory device according to claim 7, wherein when the bank busy signal is activated, a write operation for the bank is performed and a read operation for the bank is blocked.

9. The flash memory device according to claim 1, wherein the read repair information and the write repair information are associated with a same address of a defective memory cell in the bank.

10. The flash memory device according to claim 8, wherein the read redundancy circuit does not provide the read repair information to the write driver circuit and the write redundancy circuit does not provide the write repair information to the sense amplifier circuit.

11. The flash memory device according to claim 9, wherein a first entry in the read redundancy circuit includes an address of a first defective memory cell in the bank associated with the read repair information and a second entry in the read-dedicated redundancy circuit includes an address of a second defective memory cell in a second bank that is separate from the bank.

12. A flash memory device comprises:
a first redundancy circuit configured to provide read repair information for read operations to the flash memory; and
a second redundancy circuit, separate from the first redundancy circuit, configured to provide write repair information for write operations to the flash memory, wherein the first redundancy circuit is electrically connected to data lines for read operation and the second redundancy circuit is electrically connected to data lines for write operation.

13. The flash memory device according to claim 12, wherein a number of the data lines for read operation comprises N×16 bit, where N comprises an integer which is equal to or greater than 1.

14. The flash memory device according to claim 13, wherein the read repair information comprises repair information for N defective cells.

15. The flash memory device according to claim 12, wherein a number of the data lines for write operation comprises N×16 bit, where N comprises an integer which is equal to greater than 1.

16. The flash memory device according to claim 15, wherein the write repair information comprises repair information for N defective cells.

* * * * *

UNITED STATES PATENT AND TRADEMARK OFFICE
CERTIFICATE OF CORRECTION

PATENT NO. : 7,286,399 B2  Page 1 of 1
APPLICATION NO. : 11/138715
DATED : October 23, 2007
INVENTOR(S) : Im et al.

It is certified that error appears in the above-identified patent and that said Letters Patent is hereby corrected as shown below:

Column 1, Line 9: Please correct "0052290, filed"
To read -- 0055290, filed --

Signed and Sealed this

Twenty-fifth Day of December, 2007

JON W. DUDAS
*Director of the United States Patent and Trademark Office*